(12) United States Patent
Liu

(10) Patent No.: US 10,247,760 B2
(45) Date of Patent: Apr. 2, 2019

(54) APPARATUS AND METHOD FOR MEASURING PRIMARY VOLTAGE FROM THE SECONDARY SIDE OF AN ISOLATED POWER SUPPLY

(71) Applicant: LifeSafety Power, Inc., Mundelein, IL (US)

(72) Inventor: Guang Liu, Lake Zurich, IL (US)

(73) Assignee: LifeSafety Power, Inc., Mundelein, IL (US)

( * ) Notice: Subject to any disclaimer, the term of this patent is extended or adjusted under 35 U.S.C. 154(b) by 424 days.

(21) Appl. No.: 15/289,199

(22) Filed: Oct. 9, 2016

(65) Prior Publication Data

US 2018/0100881 A1  Apr. 12, 2018

(51) Int. Cl.
*G01R 15/22* (2006.01)
*G01R 31/40* (2014.01)

(52) U.S. Cl.
CPC .............. *G01R 15/22* (2013.01); *G01R 31/40* (2013.01)

(58) Field of Classification Search
CPC ................................ G01R 15/22; G01R 31/40
USPC ....................................................... 324/76.11
See application file for complete search history.

(56) References Cited

U.S. PATENT DOCUMENTS

| 7,982,427 B2 * | 7/2011 | Magana | G01R 19/16542 |
| | | | 324/426 |
| 8,508,958 B2 * | 8/2013 | Orr | H02M 3/3376 |
| | | | 363/21.02 |
| 9,980,330 B2 * | 5/2018 | Cohen | G01R 19/003 |

* cited by examiner

*Primary Examiner* — Melissa J Koval
*Assistant Examiner* — Rahul Maini
(74) *Attorney, Agent, or Firm* — Cygan Law Offices P.C.; Joseph T. Cygan

(57) ABSTRACT

An apparatus includes a zero steady state error regulator with a first input terminal operatively coupled to an isolated power supply primary voltage. A PWM (pulse width modulation) generator is operative to generate two identical PWM signals, each having a duty ratio proportional to the primary voltage. The PWM generator has an input terminal operatively coupled to the zero steady state error regulator output terminal, and has a first output terminal operatively coupled to a second input terminal of the zero steady state error regulator to a provide a feedback signal. An optical coupler has an input terminal operatively coupled to a second output terminal of the PWM generator. A scaling circuit has an input terminal operatively coupled to the optical coupler output terminal and has a scaling circuit output terminal to provide a scaled PWM output signal having a duty ratio that is linearly proportional to the primary voltage.

20 Claims, 3 Drawing Sheets

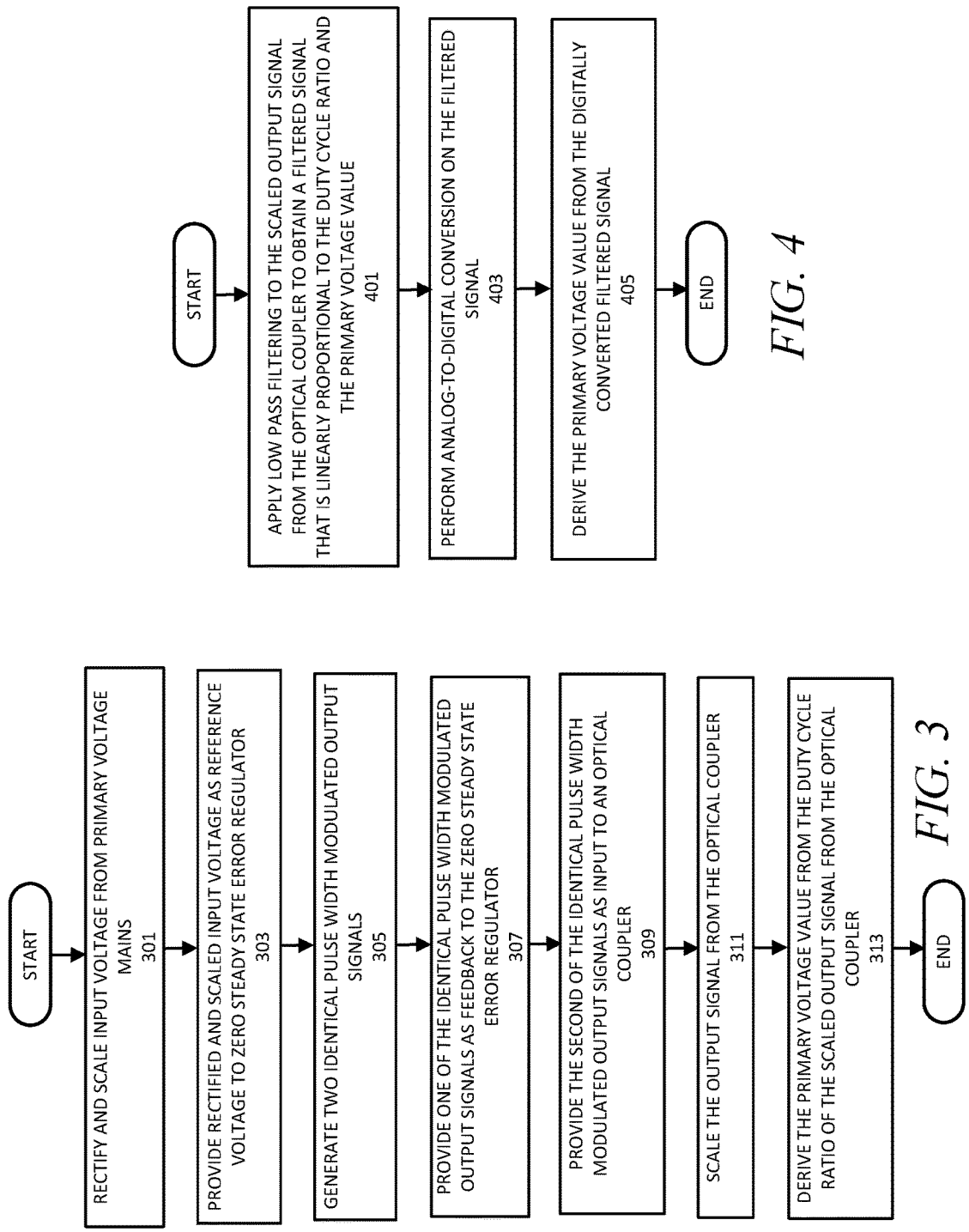

APPARATUS AND METHOD FOR MEASURING PRIMARY VOLTAGE FROM THE SECONDARY SIDE OF AN ISOLATED POWER SUPPLY

FIELD OF THE DISCLOSURE

The present disclosure relates generally to isolated power supplies and more particularly to methods and apparatuses for measuring the primary input voltage.

BACKGROUND

It is often desirable to monitor the primary input voltage (power mains voltage) in a mission critical power supply system, such as those used in security and life safety applications. Since the monitoring hardware usually resides in the secondary low voltage side, it is critical to generate an accurate measurement of the primary input voltage from the secondary side of the isolated power supply. The existing approach for obtaining a primary voltage measurement is to use a signal transformer. While this approach is sufficient for many applications, the signal transformer takes up too much space for some applications.

BRIEF DESCRIPTION OF THE DRAWINGS

FIG. 3 is a flow chart showing operation of a power supply voltage measurement apparatus in accordance with various embodiments.

FIG. 4 is a flow chart showing operation of a power supply voltage measurement apparatus in accordance with various embodiments.

DETAILED DESCRIPTION

Figure 1:
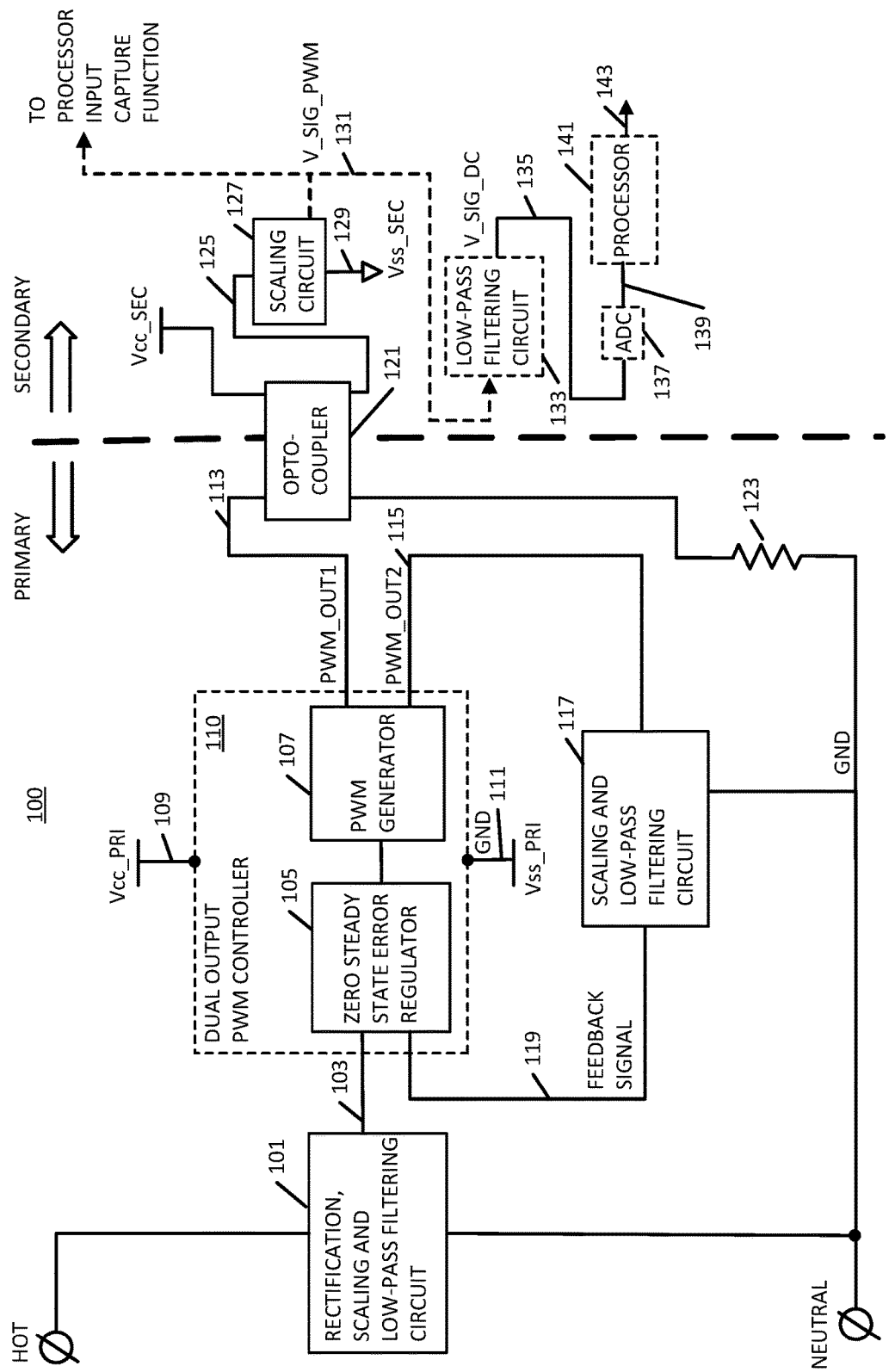
FIG. 1 is a block diagram of power supply voltage measurement apparatus in accordance with the embodiments.

Briefly, the present disclosure provides an apparatus to measure the primary input voltage from the secondary side of an isolated power supply. The disclosed apparatus generates two identical PWM (pulse width modulated) signals that have a duty ratio that is linearly proportional to the primary input voltage. The primary voltage value is then derived using the relationship of the primary input voltage value to the duty ratio of the PWM signals. The term "duty ratio" as used herein may refer to the ratio of pulse duration to pulse period, or to the ratio of average pulse power to peak pulse power. The terms "duty cycle," and/or "duty factor" may be used interchangeably with the term "duty ratio." The duty ratio may be obtained as a percentage or a decimal value in accordance with the various embodiments.

One disclosed apparatus includes a zero steady state error regulator that has a first input terminal operatively coupled to a primary voltage of an isolated power supply, and an output terminal operatively coupled to an input terminal of a PWM (pulse width modulation) generator. The PWM generator is operative to generate two identical PWM signals, each having a duty ratio proportional to the primary voltage. The PWM generator has an input terminal operatively coupled to the zero steady state error regulator output terminal, and has a first output terminal operatively coupled to a second input terminal of the zero steady state error regulator to provide a feedback signal. A second output terminal of the PWM generator is operatively coupled to an input terminal of an optical coupler. A scaling circuit has an input terminal operatively coupled to the optical coupler output terminal and has a scaling circuit output terminal to provide a scaled PWM output signal that has a duty ratio that is linearly proportional to the primary voltage.

In some embodiments, the disclosed apparatus may further include a scaling and low-pass filtering circuit that has an output terminal operatively coupled to the second input terminal of the zero steady state error regulator to provide the feedback signal, and that has an input terminal operatively coupled to the first output terminal of the PWM generator to receive one of the identical PWM signals.

In some embodiments, the disclosed apparatus may further include a rectification, scaling and low-pass filtering circuit, that has an input terminal operatively coupled to the primary voltage, and that has an output terminal operatively coupled to the first input terminal of the zero steady state error regulator.

In some embodiments, the disclosed apparatus may further include a processor, operatively coupled to the scaling circuit output terminal.

In some embodiments, the disclosed apparatus may further include a low-pass filtering circuit that has an input terminal operatively coupled to the scaling circuit output terminal; an analog-to-digital converter, operatively coupled to an output terminal of the low-pass filtering circuit; and a processor that has an input terminal operatively coupled to the analog-to-digital converter output terminal.

In some embodiments of the disclosed apparatus, the zero steady state error regulator may include an operational amplifier that has a positive terminal operatively coupled to the first output terminal of the PWM generator, where the positive terminal is the zero steady state error regulator second input terminal which receives the feedback signal, and that has an output terminal connected to the PWM generator input terminal, where the output terminal is the zero steady state error regulator output terminal; a resistor that has a first terminal connected to the primary voltage of the isolated power supply, and that has a second terminal connected to the negative terminal of the operational amplifier; and a capacitor that has a first terminal connected to the output terminal of the operational amplifier, and that has a second terminal connected to the second terminal of the resistor and to the negative terminal of the operational amplifier.

In some embodiments of the disclosed apparatus, the scaling circuit may include: a first resistor that has a first terminal connected to the optical coupler output terminal, where the first terminal of the first resistor is the scaling circuit input terminal; and a second resistor that has a first terminal connected to the second terminal of the first resistor, and that has a second terminal connected to secondary voltage negative.

In some embodiments of the disclosed apparatus, the scaling and low-pass filtering circuit may include: a first resistor that has a first terminal connected to the first output terminal of the PWM generator to receive one of the identical PWM signals, where the first terminal of the first resistor is the scaling and low-pass filtering circuit input terminal; a second resistor that has a first terminal connected in series to a second terminal of the first resistor, and that has a second terminal connected to the second input terminal of the zero steady state error regulator to provide the feedback signal, where the second terminal of the second resistor is the scaling and low-pass filtering circuit output terminal; a capacitor that has a first terminal connected to the second terminal of the first resistor and to the first terminal of the second resistor, and that has a second terminal connected to neutral of the primary voltage main; and a third resistor, connected in parallel with the capacitor.

In some embodiments of the disclosed apparatus, the rectification, scaling and low-pass filtering circuit may include: a first resistor that has a first terminal connected to the primary voltage where the first terminal is the rectification, scaling and low-pass filtering circuit input terminal; a diode that has an anode terminal connected in series to a second terminal of the first resistor; a second resistor that has a first terminal connected in series to a cathode terminal of the diode, and that has a second terminal connected to neutral of the primary voltage main; and a capacitor connected in parallel with the second resistor.

In some embodiments, the disclosed apparatus may further include a low-pass filtering circuit that has an input terminal operatively coupled to a scaling circuit output terminal. In some embodiments, the low-pass filtering circuit may include: a third resistor that has a first terminal connected to the scaling circuit output terminal; a capacitor that has a first terminal connected to a second terminal of the third resistor, and that has a second terminal connected to the second terminal of the second resistor and to secondary voltage negative.

In some embodiments, the zero steady state error regulator may include: an operational amplifier, that has a positive terminal connected to the second terminal of the second resistor, wherein the positive terminal is the zero steady state error regulator second input terminal which receives the feedback signal, and that has an output terminal connected to the PWM generator input terminal, where the output terminal is the zero steady state error regulator output terminal; a fourth resistor that has a first terminal operatively coupled to the primary voltage of the isolated power supply where the first terminal of the fourth resistor is the zero steady state error regulator first input terminal, and that has a second terminal connected to the negative terminal of the operational amplifier; and a second capacitor that has a first terminal connected to the output terminal of the operational amplifier, and that has a second terminal connected to the second terminal of the fourth resistor and to the negative terminal of the operational amplifier.

In some embodiments, the disclosed apparatus may further include: a fifth resistor that has a first terminal connected to the primary voltage where the first terminal is a rectification, scaling and low-pass filtering circuit input terminal; a diode that has an anode terminal connected in series to a second terminal of the fifth resistor; a sixth resistor that has a first terminal connected in series to a cathode terminal of the diode, and that has a second terminal connected to neutral of the primary voltage main; and a third capacitor connected in parallel with the second resistor, that has a first terminal connected to the first terminal of the sixth resistor and to the first terminal of the fourth resistor to provide a reference voltage to the zero steady state error regulator.

In some embodiments, the scaling circuit may further include: a seventh resistor that has a first terminal connected to the optical coupler output terminal, where the first terminal of the seventh resistor is the scaling circuit input terminal; and an eighth resistor that has a first terminal connected to the second terminal of the seventh resistor, and that has a second terminal connected to secondary voltage negative. The embodiments may further include a low-pass filtering circuit that has an input terminal operatively coupled to a scaling circuit output terminal. In some embodiments, the low-pass filtering circuit may include: a ninth resistor that has a first terminal connected to the scaling circuit output terminal; and a fourth capacitor that has a first terminal connected to a second terminal of the ninth resistor, and that has a second terminal connected to the second terminal of the eighth resistor and to secondary voltage negative.

A disclosed method includes: providing a rectified, scaled input voltage as a reference voltage to an zero steady state error regulator; receiving a regulated output voltage from the zero steady state error regulator by a PWM generator; generating two identical pulse PWM signals by the PWM generator, each PWM signal that has a duty ratio that is linearly proportional to the reference voltage; providing one of the identical PWM signals to the zero steady state error regulator as a feedback signal; providing a second of the identical PWM signals to an optical coupler; and scaling an output of the optical coupler to obtain a scaled output PWM signal that has a duty ratio that is linearly proportional to the input voltage.

In some embodiments, the method may further include deriving the input voltage value using the duty ratio of the scaled output PWM signal from the optical coupler. In other embodiments, the method may further include applying a low-pass filter to the scaled output PWM signal from the optical coupler to obtain a filtered signal that is linearly proportional to the duty ratio and the primary voltage. In some embodiments, the method may further include performing analog-to-digital conversion of the filtered signal to obtain a digitally converted, filtered signal; and deriving the primary voltage value from the digitally converted, filtered signal.

Turning now to the drawings wherein like numerals represent like components, FIG. 1 illustrates a power supply measurement apparatus in accordance with an embodiment. A vertical dotted line on the right hand side of FIG. 1, illustrates demarcation between the primary side and secondary side of an isolated power supply 100. Components related to the primary side of the power supply are shown on the left side of the vertical dotted line and components related to the secondary side of the power supply are shown on the right side. On the primary side, the voltage mains (hot and neutral) are operatively coupled to a rectification, scaling and low-pass filtering circuit 101.

The rectification, scaling and low-pass filtering circuit 101 is operatively coupled to zero steady state error regulator 105. The zero steady state error regulator 105 is operatively coupled to a PWM (pulse-width modulation) generator 107, which is operatively coupled to provide a first PWM output 113 to an opto-coupler 121 and to provide a second PWM output 115 to a scaling and low-pass filtering circuit 117. The scaling and low-pass filtering circuit 117 is operatively coupled to the zero steady state error regulator 105 to provide a feedback signal 119. The PWM output 113 to the opto-coupler 121 input is returned to ground through a resistor 123.

On the secondary side, the opto-coupler 121 is operatively coupled to a scaling circuit 127. The scaling circuit 127 provides a PWM voltage signal "V_SIG_PWM" 131 which is the output of the power supply measurement apparatus and is used to derive the primary input voltage value. The PWM voltage signal "V_SIG_PWM" 131 may be provided either to an Input Capture (IC) function of a processor, or may be converted into a substantially DC signal proportional to the duty ratio. In embodiments that perform this conversion, the scaling circuit 127 may be operatively coupled to a low-pass filtering circuit 133 to provide the PWM voltage signal V_SIG_PWM 131 as an input. The low-pass filtering circuit 133 may be operatively coupled to an analog-to-digital converter, ADC 137, to provide a digital output signal 139 which can be input to a processor 141 to derive the primary input voltage value 143.

The rectification, scaling and low-pass filtering circuit 101 generates a substantially DC voltage signal output "V_REF" 103, which is referenced to neutral (or primary side "Vss_PRI"), and which is linearly proportional to the input AC voltage. The DC voltage signal output V_REF 103 is provided as a reference signal input to the zero steady state error regulator 105. The zero steady state error regulator 105 in turn provides an input to the PWM generator 107. Part of the zero steady state error regulator 105 and the PWM generator 107 may be implemented as a dual-output PWM controller 110 in some embodiments, as indicated in FIG. 1 by a dotted line surrounding these components. The zero steady state error regulator 105 may be an integral regulator or a proportional-integral (PI) regulator in some embodiments. The zero steady state error regulator 105 and PWM generator 107 are sourced by the primary side voltage, i.e. Vcc_PRI 109 and Vss_PRI 111 as a ground connection.

The PWM generator 107 provides two identical PWM outputs, labeled "PWM_OUT1" 113 and "PWM_OUT2" 115, both of which are regulated by same the zero steady state error regulator 105. The PWM output PWM_OUT2 115, is provided as an input to the scaling and low-pass filtering circuit 117. The scaling and low-pass filtering circuit 117 is operative to scale and filter the PWM output signal PWM_OUT2 115 to produce the feedback signal 119 provided to the zero steady state error regulator 105. The feedback signal 119 is substantially DC and is linearly proportional to the duty ratio of the PWM output signal PWM_OUT2 115. The zero steady state error regulator 105 is operative to regulate the PWM generator 107 such that the PWM duty ratio is linearly proportional to the primary (mains) input voltage.

The PWM generator 107 PWM output signal PWM_OUT1 113, is used to drive the input side of the opto-coupler 121. The opto-coupler 121 output side, which is on the secondary low voltage side of the isolated power supply 100, provides a PWM output 125, which is provided to the scaling circuit 127 that scales the PWM output 125 to a level useable for measurement, i.e. the scaling circuit 127 output signal "V_SIG_PWM" 131. Because the duty ratio of the output signal "V_SIG_PWM" 131 is linearly proportional to the primary input voltage, the primary input voltage can be accurately derived from the duty ratio in accordance with the embodiments. The output signal "V_SIG_PWM" 131 may be handled in one of two ways in accordance with the embodiments.

One way is to provide the output signal "V_SIG_PWM" 131 to an Input Capture (IC) function of a processor (such as a microcontroller) which can perform the duty ratio measurement. Alternatively, a substantially DC signal can be generated, that is proportional to the duty ratio, by using the low-pass filtering circuit 133. Using this approach, the filtered signal "V_SIG_DC" 135 is linearly proportional to the duty ratio and the primary input voltage. An analog-to-digital converter, ADC 137 converts the filtered signal "V_SIG_DC" 135 to provide the digital value 139 to processor 141 which performs linear scaling to derive the primary input voltage measurement 143. In many applications, the ADC and the processor are integrated into a single semiconductor device, i.e. a microcontroller.

Figure 2:
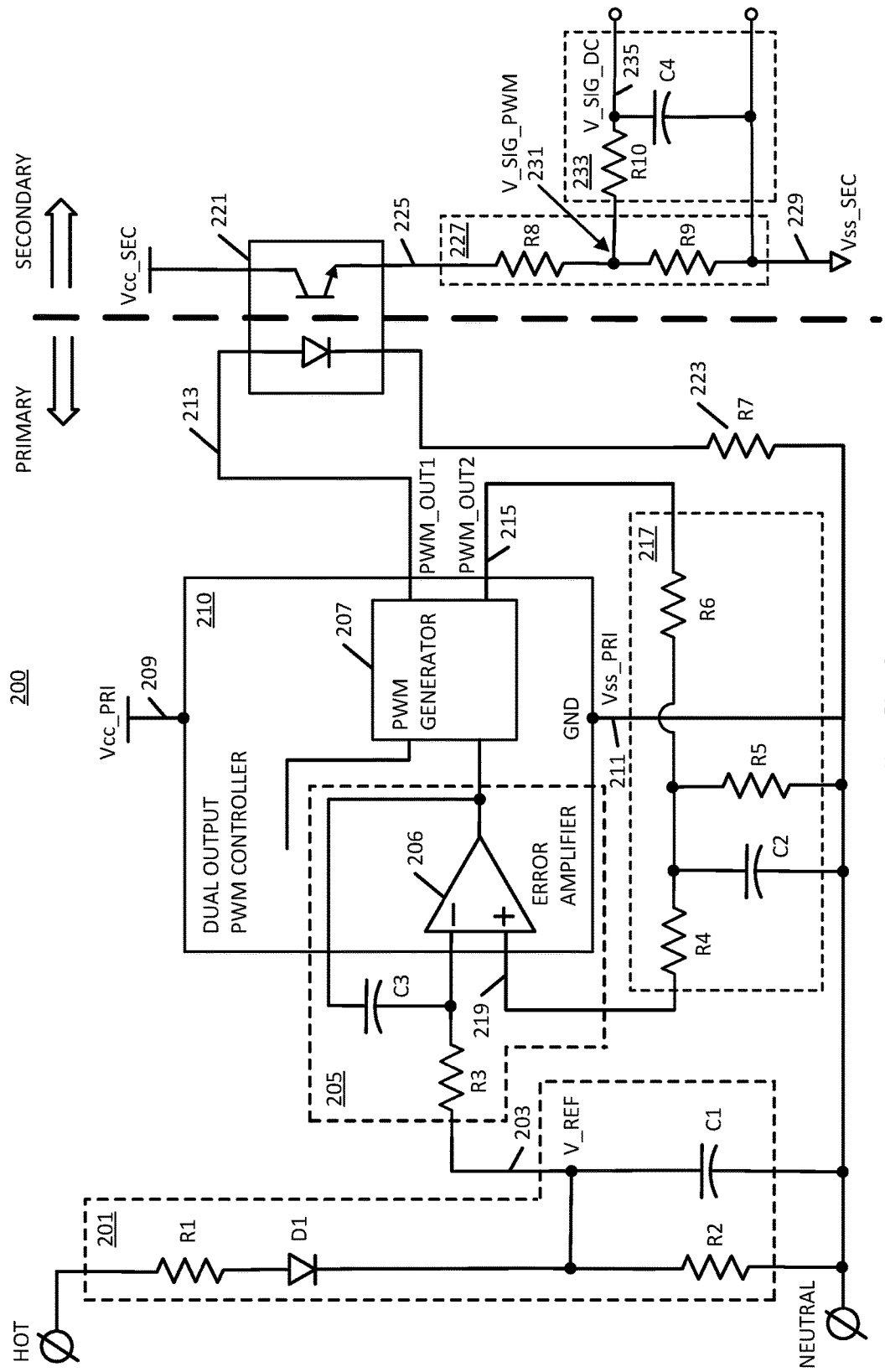
FIG. 2 is block diagram providing details of a power supply voltage measurement apparatus in accordance with an embodiment.

The block diagram of FIG. 2 provides further details of a power supply voltage measurement apparatus in accordance with an embodiment. FIG. 2 follows the same convention as FIG. 1 in that a vertical dotted line on the right hand side of FIG. 2, illustrates demarcation between the primary side and secondary side of an isolated power supply 200. Components related to the primary side of the power supply 200 are shown on the left side of the vertical dotted line and components related to the secondary side of the power supply 200 are shown on the right side.

On the primary side, the voltage mains (hot and neutral) are operatively coupled to a rectification, scaling and low-pass filtering circuit 201 which includes first resistor R1, second resistor R2, diode D1 and capacitor C1. The first resistor R1 is connected at a first terminal to the hot side voltage main with the second terminal connected in series with the diode D1 anode terminal. The diode D1 cathode terminal is connected in series to a first terminal of second resistor R2, and the second terminal of resistor R2 is connected to the neutral side voltage main. The capacitor C1 is connected in parallel with the second resistor R2.

It is to be understood that the terms "first terminal" and "second terminal" as used herein are relative terms for purposes of facilitating description of circuit element connections with respect to the drawing figure representations only and are not to be construed as limiting with respect to any of the various embodiments.

The rectification, scaling and low-pass filtering circuit 201 generates a substantially DC voltage signal "V_REF" 203 at a node connecting the diode D1 cathode to resistor R2 and capacitor C1. The DC voltage signal V_REF 203 is referenced to neutral (or primary side "Vss_PRI"), and is linearly proportional to the input AC voltage. The DC voltage signal output V_REF 203 is provided as a reference signal input to the zero steady state error regulator 205. The zero steady state error regulator 205 includes a resistor R3, capacitor C3, and an operational amplifier, error amplifier 206. The DC voltage signal output V_REF 203 is provided to a first terminal of resistor R3. The second terminal of resistor R3 is connected to a negative terminal of error amplifier 206, and to a second terminal of capacitor C3. The first terminal of capacitor C3 is connected to the output terminal of error amplifier 206.

In the example embodiment of FIG. 2, the error amplifier 206 is included in a dual output PWM controller 210, which also includes a PWM generator 207. The output terminal of the error amplifier 206 is operatively coupled to the PWM generator 207. The dual output PWM controller 210 is sourced by the primary side voltage, i.e. Vcc_PRI 209 and Vss_PRI 211 as a ground connection.

The dual output PWM controller 210, by way of the PWM generator 207, provides two identical PWM outputs, PWM_OUT1 213 and PWM_OUT2 215, both of which are regulated by the same zero steady state error regulator 205, i.e. by using error amplifier 206. The PWM output PWM_OUT2 215, is provided as an input to the scaling and low-pass filtering circuit 217. The scaling and low-pass filtering circuit 217 is operative to scale and filter the PWM output signal PWM_OUT2 215 to produce the feedback signal 219 provided to the zero steady state error regulator 205. The feedback signal 219 is substantially DC and is linearly proportional to the duty ratio of the PWM output signal PWM_OUT2 215. The zero steady state error regulator 205 is operative to regulate the PWM generator 207 such that the PWM duty ratio is linearly proportional to the primary (mains) input voltage.

The scaling and low-pass filtering circuit 217 includes resistor R4, resistor R5, resistor R6 and capacitor C2. The dual output PWM controller 210 PWM output PWM_OUT2

215 is connected to a first terminal of resistor R6. The second terminal of resistor R6 is connected to a first terminal of resistor R5, a first terminal of resistor R4, and a first terminal of capacitor C2. The second terminal of resistor R4 is connected to a positive terminal of error amplifier 206 to provide the feedback signal 219. Resistor R5 and capacitor C2 are connected in parallel such the second terminal of resistor R5 and the second terminal of capacitor C2 are both connected to neutral.

The PWM output signal PWM_OUT1 213, is used to drive the input side of the opto-coupler 221. The PWM output signal PWM_OUT1 213 to the opto-coupler 221 input is returned to ground through resistor R7 223. The opto-coupler 221 output side, which is on the secondary low voltage side of the isolated power supply 200, provides a PWM output 225, which is provided to the scaling circuit 227 that scales the PWM output 225 to a level useable for measurement, i.e. the scaling circuit 227 output signal "V_SIG_PWM" 231. The scaling circuit 227 includes resistor R8 and resistor R9. A first terminal of resistor R8 is connected to an output terminal of opto-coupler 221. The second terminal of resistor R8 is connected to a first terminal of resistor R9. The second terminal of resistor R9 is connected to Vss_SEC (i.e. secondary voltage negative). The output "V_SIG_PWM" 231 of the scaling circuit 227 is obtained at the node that connects the second terminal of resistor R8 to the first terminal of resistor R9.

As discussed in the first example provided in FIG. 1, because the duty ratio of the output signal "V_SIG_PWM" 231 is linearly proportional to the primary input voltage, the primary input voltage can be accurately derived from the duty ratio in accordance with the embodiments. The output signal "V_SIG_PWM" 231 may also be handled in one of two ways in accordance with the embodiments as previously described with respect to FIG. 1.

For example, the output signal V_SIG_PWM 231 may be operatively coupled to an IC function of a processor (such as a microcontroller) which can perform the duty ratio measurement. Alternatively, a substantially DC signal can be generated, that is proportional to the duty ratio, by using the low-pass filtering circuit 233 which includes a resistor R10 and a capacitor C4. A first terminal of resistor R10 is connected to the output of scaling circuit 227 to receive the output signal V_SIG_PWM 231. The second terminal of resistor R10 is connected to a first terminal of capacitor C4. The second terminal of capacitor C4 is connected to the second terminal of resistor R9, which is connected to secondary voltage negative, i.e. Vss_SEC.

The output of the low-pass filtering circuit 233, "V_SIG_DC" 235, is obtained at the node connecting the second terminal of resistor R10 to the first terminal of capacitor C4. The filtered signal V_SIG_DC 235 is linearly proportional to the duty ratio and the primary input voltage. As discussed with respect to the example of FIG. 1, the filter signal V_SIG_DC 235 may be provided to an ADC to convert the filtered signal V_SIG_DC 235 to provide a digital value to a processor which may perform linear scaling to derive the primary input voltage measurement.

FIG. 3 is a flow chart showing operation of a power supply voltage measurement apparatus in accordance with various embodiments. The method of operation begins, and in operation block 301, the power supply voltage measurement apparatus rectifies and scales an input voltage obtained from the primary voltage mains. In operation block 303, the power supply voltage measurement apparatus provides the rectified and scaled input voltage as a reference voltage to a zero steady state error regulator. In operation block 305, the power supply voltage measurement apparatus generates two identical PWM output signals that are regulated by a zero steady state error regulator. These PWM output signals have duty ratios that are linearly proportional to the input voltage, i.e. to the primary voltage mains. In operation block 307, the power supply voltage measurement apparatus provides one of the identical PWM output signals as feedback to the zero steady state error regulator. In operation block 309, the power supply voltage measurement apparatus provides the second PWM output signal as an input to an optical coupler, and scales the output of the optical coupler in operation block 311. In operation block 313, the primary voltage value is derived from the duty ratio of the scaled output signal from the optical coupler. The method of operation then ends as shown.

FIG. 4 is a flow chart showing operation of a power supply voltage measurement apparatus in accordance with an embodiment in which the output signal from the optical coupler is filtered. The method of operation begins subsequent to the operation shown in operation block 311 of FIG. 3. In the operation of FIG. 4, the operation in operation block 313 is omitted. In operation block 401, low-pass filtering is applied to the scaled output signal from the optical coupler to obtain a filtered signal that is linearly proportional to the duty ratio, and the primary voltage value. In operation block 403, analog-to-digital conversion is performed on the filtered signal and, in operation block 405, the primary voltage value is derived from the digitally converted, filtered signal. The method of operation then ends as shown.

While various embodiments have been illustrated and described, it is to be understood that the invention is not so limited. Numerous modifications, changes, variations, substitutions and equivalents will occur to those skilled in the art without departing from the scope of the present invention as defined by the appended claims.

What is claimed is:

1. An apparatus comprising:
a zero steady state error regulator, having a first input terminal operatively coupled to a primary voltage of an isolated power supply;
a PWM (pulse width modulation) generator operative to generate two identical PWM signals, each having a duty ratio proportional to the primary voltage, the PWM generator having an input terminal operatively coupled to the zero steady state error regulator output terminal, and having a first output terminal operatively coupled to a second input terminal of the zero steady state error regulator to a provide a feedback signal;
an optical coupler having an input terminal operatively coupled to a second output terminal of the PWM generator; and
a scaling circuit, having an input terminal operatively coupled to the optical coupler output terminal and having a scaling circuit output terminal to provide a scaled PWM output signal having a duty ratio that is linearly proportional to the primary voltage.

2. The apparatus of claim 1, further comprising:
a scaling and low-pass filtering circuit, having an output terminal operatively coupled to the second input terminal of the zero steady state error regulator to provide the feedback signal, and having an input terminal operatively coupled to the first output terminal of the PWM generator to receive one of the identical PWM signals.

3. The apparatus of claim 1, further comprising:
a rectification, scaling and low-pass filtering circuit, having an input terminal operatively coupled to the primary voltage, and having an output terminal operatively coupled to the first input terminal of the zero steady state error regulator.

4. The apparatus of claim 1, further comprising:
a processor, operatively coupled to the scaling circuit output terminal.

5. The apparatus of claim 1, further comprising:
a low-pass filtering circuit, having an input terminal operatively coupled to the scaling circuit output terminal;
an analog-to-digital converter, operatively coupled to an output terminal of the low-pass filtering circuit; and
a processor, having an input terminal operatively coupled to the analog-to-digital converter output terminal.

6. The apparatus of claim 1, wherein the zero steady state error regulator comprises:
an operational amplifier, having a positive terminal operatively coupled to the first output terminal of the PWM generator, wherein the positive terminal is the zero steady state error regulator second input terminal which receives the feedback signal, and having an output terminal connected to the PWM generator input terminal, where the output terminal is the zero steady state error regulator output terminal;
a resistor having a first terminal connected to the primary voltage of the isolated power supply, and having a second terminal connected to the negative terminal of the operational amplifier; and
a capacitor having a first terminal connected to the output terminal of the operational amplifier, and having a second terminal connected to the second terminal of the resistor and to the negative terminal of the operational amplifier.

7. The apparatus of claim 1, wherein the scaling circuit comprises:
a first resistor having a first terminal connected to the optical coupler output terminal, where the first terminal of the first resistor is the scaling circuit input terminal; and
a second resistor having a first terminal connected to the second terminal of the first resistor, and having a second terminal connected to secondary voltage negative.

8. The apparatus of claim 2, wherein the scaling and low-pass filtering circuit comprises:
a first resistor having a first terminal connected to the first output terminal of the PWM generator to receive one of the identical PWM signals, where the first terminal of the first resistor is the scaling and low-pass filtering circuit input terminal;
a second resistor having a first terminal connected in series to a second terminal of the first resistor, and having a second terminal connected to the second input terminal of the zero steady state error regulator to provide the feedback signal, where the second terminal of the second resistor is the scaling and low-pass filtering circuit output terminal;
a capacitor having a first terminal connected to the second terminal of the first resistor and to the first terminal of the second resistor, and having a second terminal connected to neutral of the primary voltage main; and
a third resistor, connected in parallel with the capacitor.

9. The apparatus of claim 3, wherein the rectification, scaling and low-pass filtering circuit comprises:

a first resistor having a first terminal connected to the primary voltage where the first terminal is the rectification, scaling and low-pass filtering circuit input terminal;
a diode having an anode terminal connected in series to a second terminal of the first resistor;
a second resistor having a first terminal connected in series to a cathode terminal of the diode, and having a second terminal connected to neutral of the primary voltage main; and
a capacitor connected in parallel with the second resistor.

10. The apparatus of claim 7, further comprising:
a low-pass filtering circuit, having an input terminal operatively coupled to a scaling circuit output terminal.

11. The apparatus of claim 10, where the low-pass filtering circuit comprises:
a third resistor having a first terminal connected to the scaling circuit output terminal;
a capacitor having a first terminal connected to a second terminal of the third resistor, and having a second terminal connected to the second terminal of the second resistor and to secondary voltage negative.

12. The apparatus of claim 8, wherein the zero steady state error regulator comprises:
an operational amplifier, having a positive terminal connected to the second terminal of the second resistor, wherein the positive terminal is the zero steady state error regulator second input terminal which receives the feedback signal, and having an output terminal connected to the PWM generator input terminal, where the output terminal is the zero steady state error regulator output terminal;
a fourth resistor having a first terminal operatively coupled to the primary voltage of the isolated power supply where the first terminal of the fourth resistor is the zero steady state error regulator first input terminal, and having a second terminal connected to the negative terminal of the operational amplifier; and
a second capacitor having a first terminal connected to the output terminal of the operational amplifier, and having a second terminal connected to the second terminal of the fourth resistor and to the negative terminal of the operational amplifier.

13. The apparatus of claim 12, further comprising:
a fifth resistor having a first terminal connected to the primary voltage where the first terminal is a rectification, scaling and low-pass filtering circuit input terminal;
a diode having an anode terminal connected in series to a second terminal of the fifth resistor;
a sixth resistor having a first terminal connected in series to a cathode terminal of the diode, and having a second terminal connected to neutral of the primary voltage main; and
a third capacitor connected in parallel with the second resistor, having a first terminal connected to the first terminal of the sixth resistor and to the first terminal of the fourth resistor to provide a reference voltage to the zero steady state error regulator.

14. The apparatus of claim 13, wherein the scaling circuit comprises:
a seventh resistor having a first terminal connected to the optical coupler output terminal, where the first terminal of the seventh resistor is the scaling circuit input terminal; and an eighth resistor having a first terminal connected to the second terminal of the seventh resistor, and having a second terminal connected to secondary voltage negative.

15. The apparatus of claim 14, further comprising:
a low-pass filtering circuit, having an input terminal operatively coupled to a scaling circuit output terminal.

16. The apparatus of claim 15, where the low-pass filtering circuit comprises:
a ninth resistor having a first terminal connected to the scaling circuit output terminal; and
a fourth capacitor having a first terminal connected to a second terminal of the ninth resistor, and having a second terminal connected to the second terminal of the eighth resistor and to secondary voltage negative.

17. A method comprising:
providing a rectified, scaled input voltage as a reference voltage to an zero steady state error regulator;
receiving a regulated output voltage from the zero steady state error regulator by a PWM (pulse width modulation) generator;
generating two identical pulse PWM signals by the PWM generator, each PWM signal having a duty ratio that is linearly proportional to the reference voltage;
providing one of the identical PWM signals to the zero steady state error regulator as a feedback signal;
providing a second of the identical PWM signals to an optical coupler; and
scaling an output of the optical coupler to obtain a scaled output PWM signal having a duty ratio that is linearly proportional to the input voltage.

18. The method of claim 17, further comprising:
deriving the input voltage value using the duty ratio of the scaled output PWM signal from the optical coupler.

19. The method of claim 17, further comprising:
applying a low-pass filter to the scaled output PWM signal from the optical coupler to obtain a filtered signal that is linearly proportional to the duty ratio and the primary voltage.

20. The method of claim 19, further comprising:
performing analog-to-digital conversion of the filtered signal to obtain a digitally converted, filtered signal; and
deriving the primary voltage value from the digitally converted, filtered signal.

* * * * *